United States Patent
Fifield et al.

(10) Patent No.: US 8,296,817 B2
(45) Date of Patent: Oct. 23, 2012

(54) APPARATUS FOR TRANSPORTING HOME NETWORKING FRAME-BASED COMMUNICATIONS SIGNALS OVER COAXIAL CABLES

(75) Inventors: David Fifield, San Jose, CA (US); Jason Alexander Trachewsky, Menlo Park, CA (US); John T. Holloway, Atherton, CA (US)

(73) Assignee: Broadcom Corporation, Irvine, CA (US)

( * ) Notice: Subject to any disclaimer, the term of this patent is extended or adjusted under 35 U.S.C. 154(b) by 2893 days.

(21) Appl. No.: 10/150,187

(22) Filed: May 16, 2002

(65) Prior Publication Data

US 2002/0174423 A1 Nov. 21, 2002

Related U.S. Application Data

(60) Provisional application No. 60/291,770, filed on May 17, 2001.

(51) Int. Cl.
*H04N 7/173* (2011.01)
(52) U.S. Cl. .......................... 725/127; 725/1
(58) Field of Classification Search .................. 725/127
See application file for complete search history.

(56) References Cited

U.S. PATENT DOCUMENTS

| | | | |
|---|---|---|---|
| 4,125,810 A * | 11/1978 | Pavio | 455/327 |
| 5,027,426 A | 6/1991 | Chiocca, Jr. | |
| 5,296,823 A * | 3/1994 | Dietrich | 333/26 |
| 5,440,335 A | 8/1995 | Beveridge | |
| 5,642,155 A | 6/1997 | Cheng | |
| 5,729,824 A | 3/1998 | O'Neill et al. | |
| 5,893,024 A * | 4/1999 | Sanders et al. | 725/125 |
| 6,118,974 A * | 9/2000 | Holliday et al. | 725/127 |
| 6,144,399 A * | 11/2000 | Manchester et al. | 725/127 |
| 6,418,149 B1 * | 7/2002 | Swisher et al. | 370/487 |
| 6,574,236 B1 * | 6/2003 | Gosselin et al. | 370/465 |
| 2002/0059642 A1 * | 5/2002 | Russ et al. | 725/135 |

* cited by examiner

*Primary Examiner* — Pankaj Kumar
*Assistant Examiner* — Sahar Baig
(74) *Attorney, Agent, or Firm* — Brake Hughes Bellermann, LLP

(57) ABSTRACT

A method and apparatus for coupling a system propagating home networking communications signals over telephone lines to a system propagating television signals over a coaxial cable system to a television device. A three port adapter has a phone line port, a first coaxial cable port and a second coaxial cable port. The first coaxial cable port is coupled to the phone line port through a low pass filter and wideband balun adapted to pass home networking communications signals while being adapted to reject television signals. The first coaxial cable port is also coupled to the second coaxial port through a high pass filter while being adapted to reject home networking communications signals. The phone line port is coupled to the system propagating home networking communications signals. The first coaxial cable port is coupled to the system propagating television signals over coaxial cable. The second coaxial cable port to the television device.

8 Claims, 19 Drawing Sheets

| SERVICE | FREQUENCY(MHz) |
|---|---|
| DOWNSTREAM CABLE BROADCAST | 55~1000 |
| DOWNSTREAM ARIAL BROADCAST | 54~84, 174~216, 470~806 |
| DOWNSTREAM CABLE MODEM | 50-54 ~ 300-864 |
| NORTH AMERICAN UPSTREAM CABLE MODEM | 5~42 |
| EUROPEAN UPSTREAM CABLE MODEM | 5~65 |
| UPSTREAM CONDITIONAL ACCESS | 8~12 |
| IF LOCAL OSCILLATOR LEAKAGE | ABOUT 6 |
| BI-DIRECTIONAL IR REPEATERS | 5.6 |
| BI-DIRECTIONAL REMODULATORS- TYPICALLY ON CHANNEL 3 OR 4 | CH 3 60~66 CH 4 66~72 |

FIG.2

| SERVICE | FREQUENCY(MHz) |
|---|---|
| DOWNSTREAM CABLE BROADCAST | 55~1000 |
| DOWNSTREAM ARIAL BROADCAST | 54~84, 174~216, 470~806 |
| DOWNSTREAM CABLE MODEM | 50-54 ~ 300-864 |
| NORTH AMERICAN UPSTREAM CABLE MODEM | 5~42 |
| EUROPEAN UPSTREAM CABLE MODEM | 5~65 |
| UPSTREAM CONDITIONAL ACCESS | 8~12 |
| IF LOCAL OSCILLATOR LEAKAGE | ABOUT 6 |
| BI-DIRECTIONAL IR REPEATERS | 5.6 |
| BI-DIRECTIONAL REMODULATORS- TYPICALLY ON CHANNEL 3 OR 4 | CH 3 60~66<br>CH 4 66~72 |

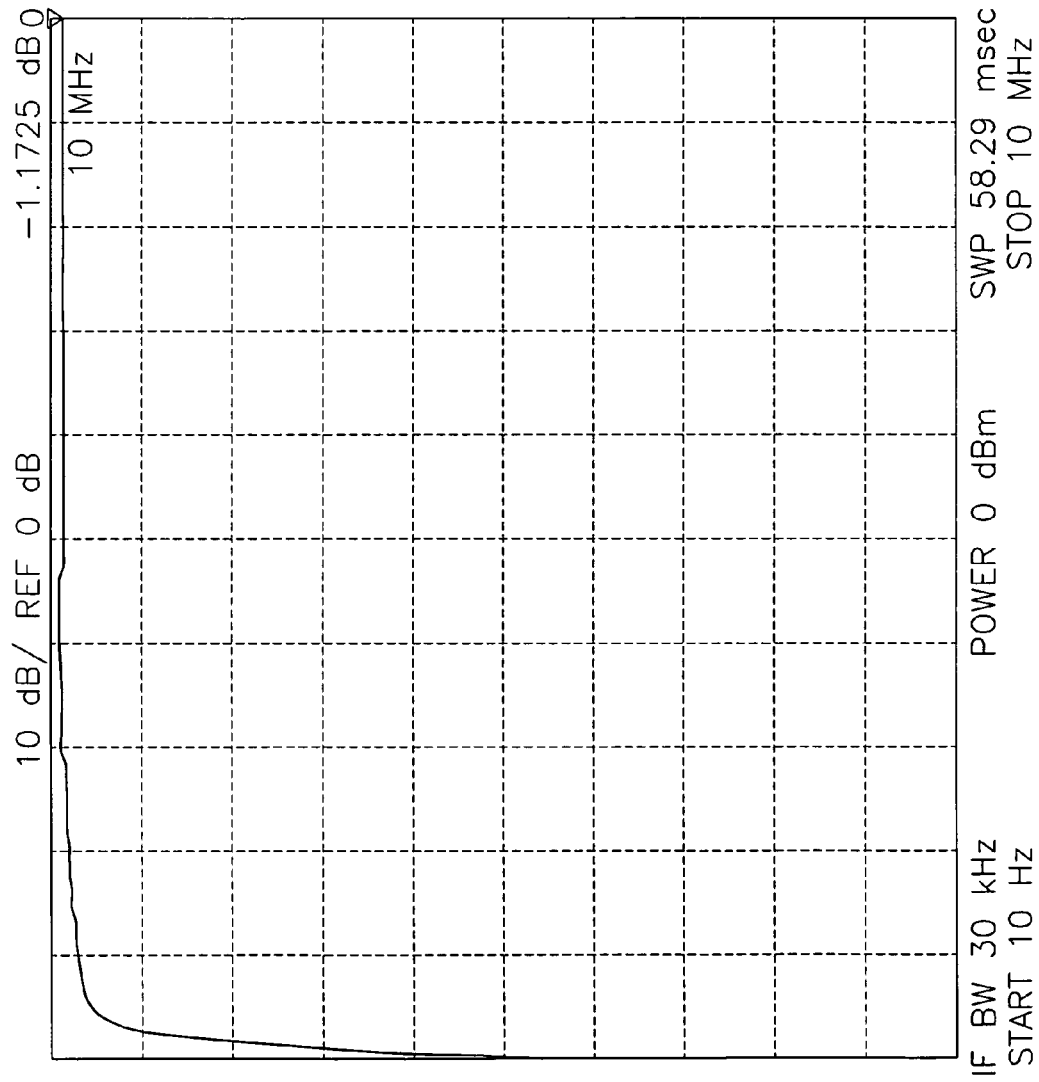

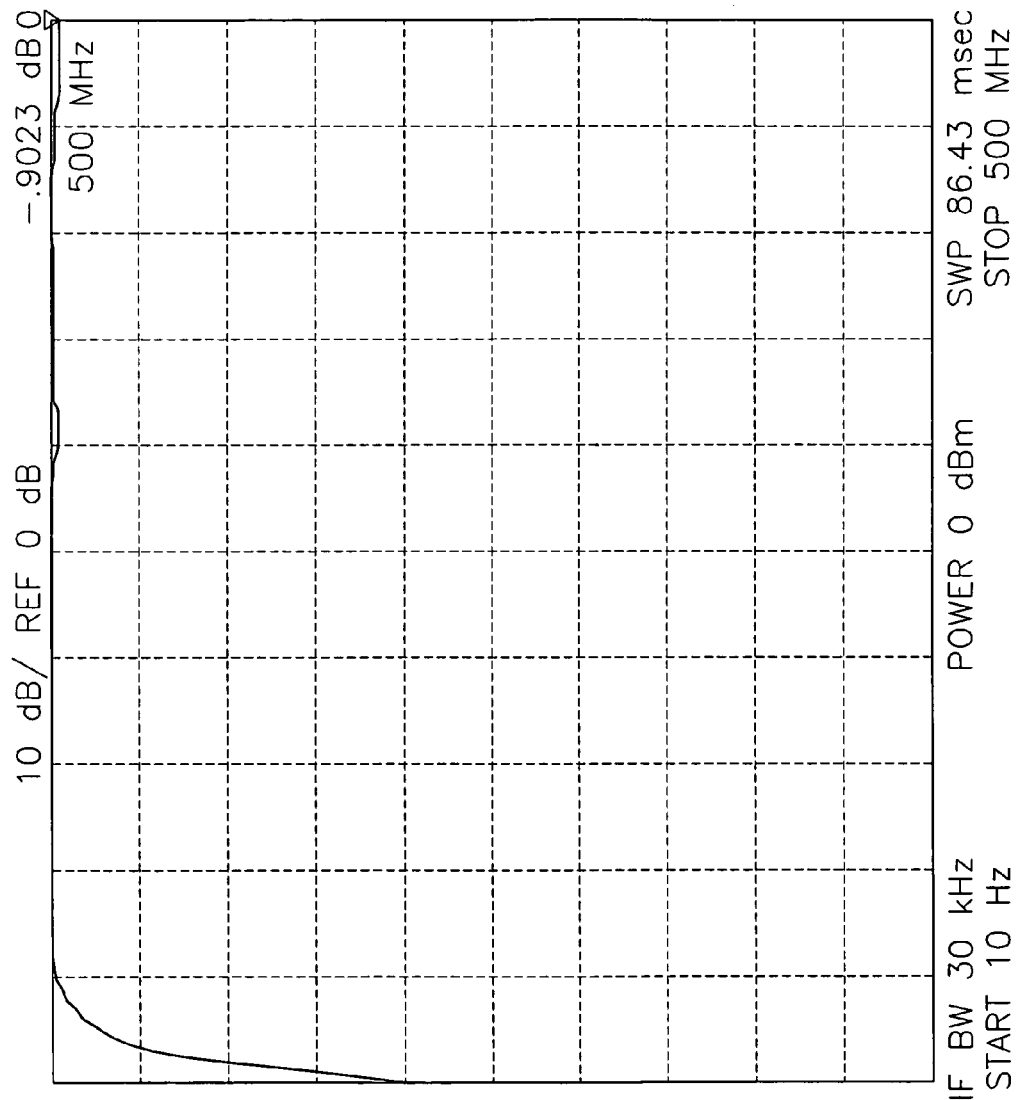

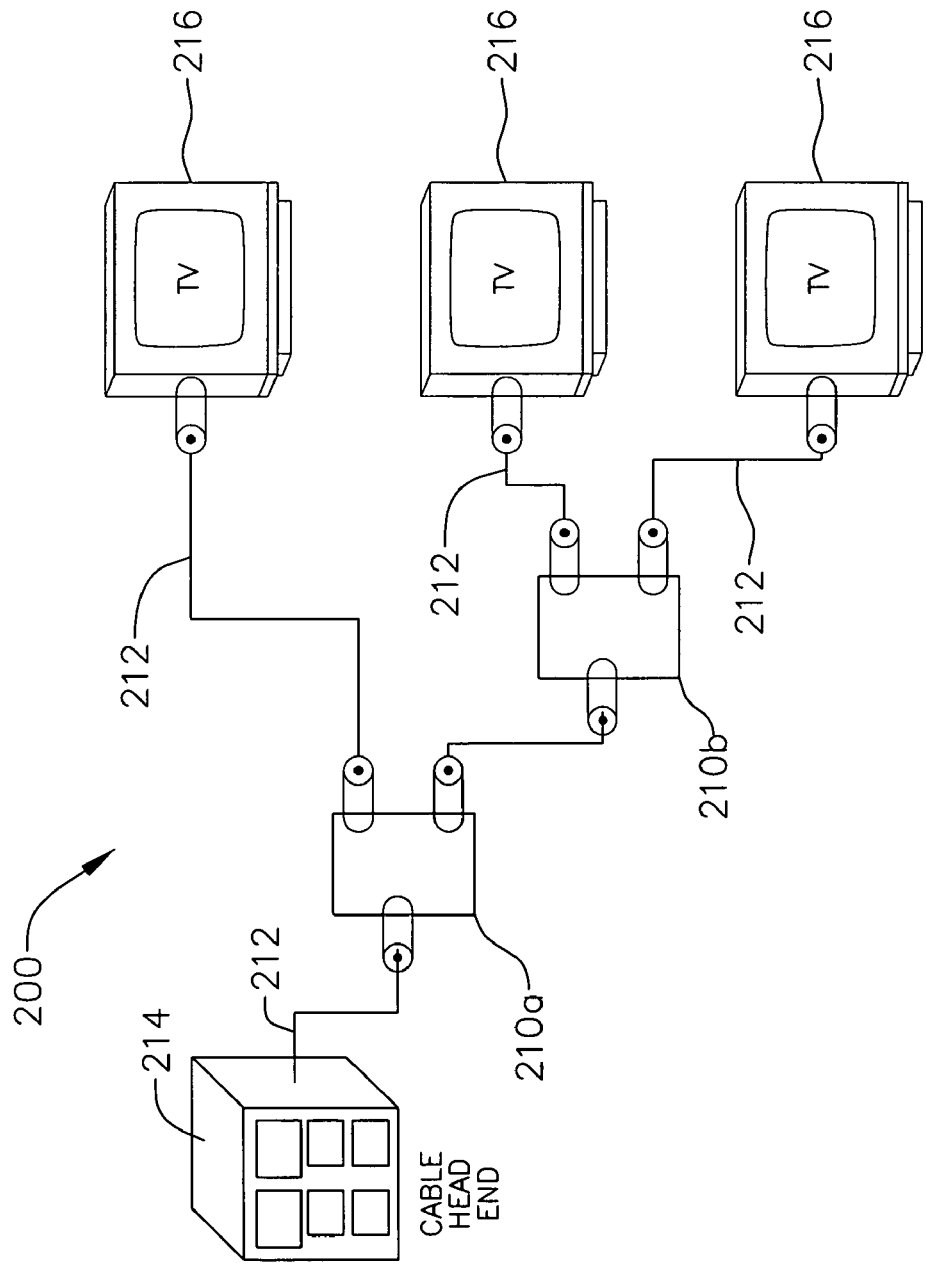

APPARATUS FOR TRANSPORTING HOME NETWORKING FRAME-BASED COMMUNICATIONS SIGNALS OVER COAXIAL CABLES

CROSS-REFERENCE TO RELATED APPLICATION

This patent application claims priority to and the benefit of the filing date of U.S. Provisional Patent Application No. 60/291,770 filed May 17, 2001.

BACKGROUND OF THE INVENTION

The present invention relates to the field of communications, and, in particular, to a frame-based communications network utilized by consumers on customer premises.

As computers become more and more cost effective for the everyday consumer and for small businesses, such computers become more plentiful for use within local area environments such as homes, office buildings and the like. For example, within a home a person with a computer in the bedroom, and another in the living room, may want to share common files, utilize a common digital subscriber line (DSL), or otherwise transfer information between the computers. Accordingly, various technologies are being developed for computer interconnection of multiple computers located within such environments. One example of such technologies are the Home Phoneline Network Alliance (HPNA) specifications for local area network (LAN) computer interconnection which utilize existing telephone lines within the local environment for the transmission of data packets between the computers, as described in detail in copending U.S. patent application Ser. No. 09/826,239 filed on Apr. 4, 2001, entitled "Transceiver Method and Signal Therefor Embodied in a Carrier Wave for a Frame-Based Communications Network", and as implemented in Broadcom Corporations' ILINE ™ family of products.

FIG. 1 shows in block diagram form a general home networking environment within which the present invention can be implemented. Home network 10 includes existing (installed) plain old telephone service (POTS) wiring 12, network clients 14, the computer port side of modem 16 and fax 18. POTS wiring 12 provides wiring infrastructure used to network multiple clients at a customer premises (e.g., home or office) 20. POTS wiring 12 can be conventional unshielded twisted pair (UTP) wiring that is generally routed internally in the walls of the customer premises 20 to various locations (e.g., rooms) within the customer premises. POTS telephones 26 are typically connected to POTS wiring 12. Subscriber loop 22(also called a local loop) is a physical wiring link that directly connects an individual customer premises 20 to the Central Office through telephone network interface 24, a demarcation point between the inside and outside of customer premises 20. Of particular importance for residential networks are systems that provide communication between computers as reliably and with as high a data rate as possible. Communication over residential telephone wiring is provided through frame-oriented link, media access and physical layer protocols.

Further, in most cases today, a home's entertainment center (e.g., televisions)is not networked in any way. Typically, a phone jack is not present at or near most home entertainment centers. It is normally too expensive or undesirable to add new wiring to provide a new phone jack. Likewise, an Ethernet LAN network connection is too costly and troublesome to provision for such home entertainment centers as opposed to its use in computer networking. Some cable television installers have used inexpensive HF band FM wireless modems to provide a simple, low bandwidth analog modem connection to the home entertainment system. This enables low-speed Internet access and pay-per-view services. These low speed wireless modem links are not suitable for high bandwidth, high quality video or Voice over IP (VoIP) services.

Other, higher bandwidth, wireless networking products such as those implementing the IEEE 802.11b specification and more recently the IEEE 802.1a specification are available, but these products suffer from poor link reliability over even fairly short transmission distances and cannot offer the low bit error rates necessary to carry digital video without significant interruption to the viewer. Additionally, high bandwidth wireless nodes are relatively expensive when compared to using HPNA 2.0 over existing coaxial cable. However, at or very near almost every home entertainment center there is pre-wired coaxial cable (e.g., RG-6 or RG-59 coax) that feeds the cable television or TV antenna signal to other rooms in the house. Typically, coax is installed to all the other likely entertainment locations in the house—the bedrooms, the study, the family room or lounge—making coax ideal for the delivery of high-speed digital content to exactly where it is desired.

In addition to physical installation considerations, when designing home networks another important consideration is spectral management. The coaxial cabling within a typical home is subject to several sources of ingress. In addition to the expected terrestrial broadcast and cable broadcast television signals, other intentional signals such as cable modems or set top box conditional access signals may be present. Examples of the several signals of services and frequencies that may be present on household coaxial cable and may interfere with each other are shown in FIG. 2. Additionally, there are some unintentional noise sources on the household coaxial cable. Older built-in TV tuners can generate significant amounts of intermediate frequency (IF) egress out of their antenna/cable TV F-connectors. Televisions that are directly connected to the coaxial cable may cause some interference to the HPNA signals on the coaxial cable.

Given the HPNA home networking system depicted in FIG. 1, and the desirability that the HPNA home networking system be interconnected to pre-existing coaxial cable system (s) within the home, such as one connecting cable TV, and the desirability of appropriately managing the spectrum on the coaxial cable network, a need therefore exists for a system, method and apparatus for transporting home networking frame-based communications signals over coaxial cables. The present invention provides a solution to meet such need.

SUMMARY OF THE INVENTION

In one embodiment of the present invention a method and apparatus is provided for coupling a system propagating home networking communications signals over telephone lines to a system propagating television signals over a coaxial cable system to a television device. A three port adapter has a phone line port, a first coaxial cable port and a second coaxial cable port. The first coaxial cable port is coupled to the phone line port through a low pass filter and wideband balun adapted to pass home networking communications signals while being adapted to reject television signals. The first coaxial cable port is also coupled to the second coaxial port through a high pass filter while being adapted to reject home networking communications signals. The phone line port is coupled to the system propagating home networking communications signals. The first coaxial cable port is coupled to the system propagating television signals over coaxial cable. The second coaxial cable port is coupled to the television device. The three port adapter includes a DC bypass path between the first coaxial port and the second coaxial cable port. The low pass filter passes signals in the 4 to 30 MHz band and the high pass filter passes signals greater than 30 MHz. The wideband balun includes a transformer for matching 75 ohm coaxial cable to an approximately 100 ohm to 135 ohm twisted, untwisted, shielded or unshielded wire pair. The wire pair can be a phone line.

In another embodiment of the present invention a method and apparatus for splitting television signals propagating over a coaxial cable system is provided. A three port adapter has a first coaxial cable port, a second coaxial cable port and a third coaxial cable port. The first coaxial cable port splits power between the second coaxial port and the third coaxial port through a ferrite bead splitter. The first coaxial cable port, the second coaxial cable port and the third coaxial cable port are coupled to each other through an inductor/capacitor circuit adapted to provide a low loss path there between at frequencies propagating home networking communication signals.

As will become readily apparent in view of the detailed description set forth below, network communication utilizing HPNA 2.0 16/32 Mbps home networking communication signal technology sharing a home's existing coaxial cable provides high-speed networking for delivery of high quality digital video, voice over IP (VoIP) and shared broadband Internet access throughout the house without adding any new wires. HPNA 2.0 can be added to the existing coaxial cable and be totally compatible with the existing cable TV or off-air TV signals. Additionally, HPNA 2.0 nodes are relatively inexpensive. Further, as more bandwidth is required, future HPNA standards that provide up to 100 Mbps could be employed over exactly the same network infrastructure, offering a simple upgrade path for future services such as high definition television.

BRIEF DESCRIPTION OF THE DRAWINGS

FIG. 2 shows in table format examples of several signals of services and frequencies that may be present on household coaxial cable and which may interfere with each other.

FIGS. 6a and 6b show the coax port to HPNA port frequency response of the three port adapter depicted in FIGS. 4 and 5.

FIG. 7 shows the coax port to TV port frequency response of the three port adapter depicted in FIGS. 4 and 5.

FIGS. 10a and 10b show typical customer premises coaxial cable environments.

DETAILED DESCRIPTION OF THE INVENTION

Figure 1:
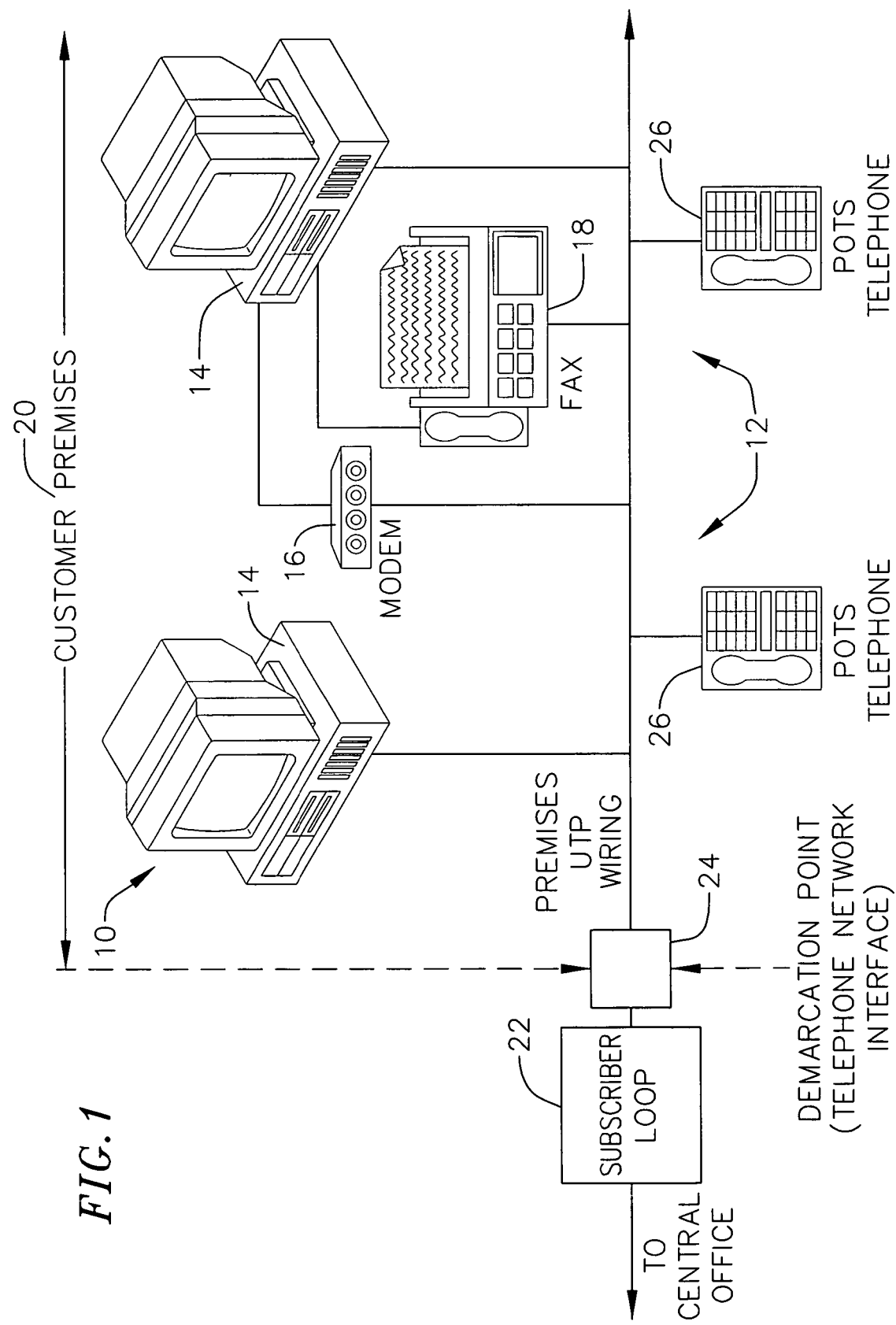
FIG. 1 shows in block diagram form a general home networking environment within which the present invention can be implemented.
Figure 3:
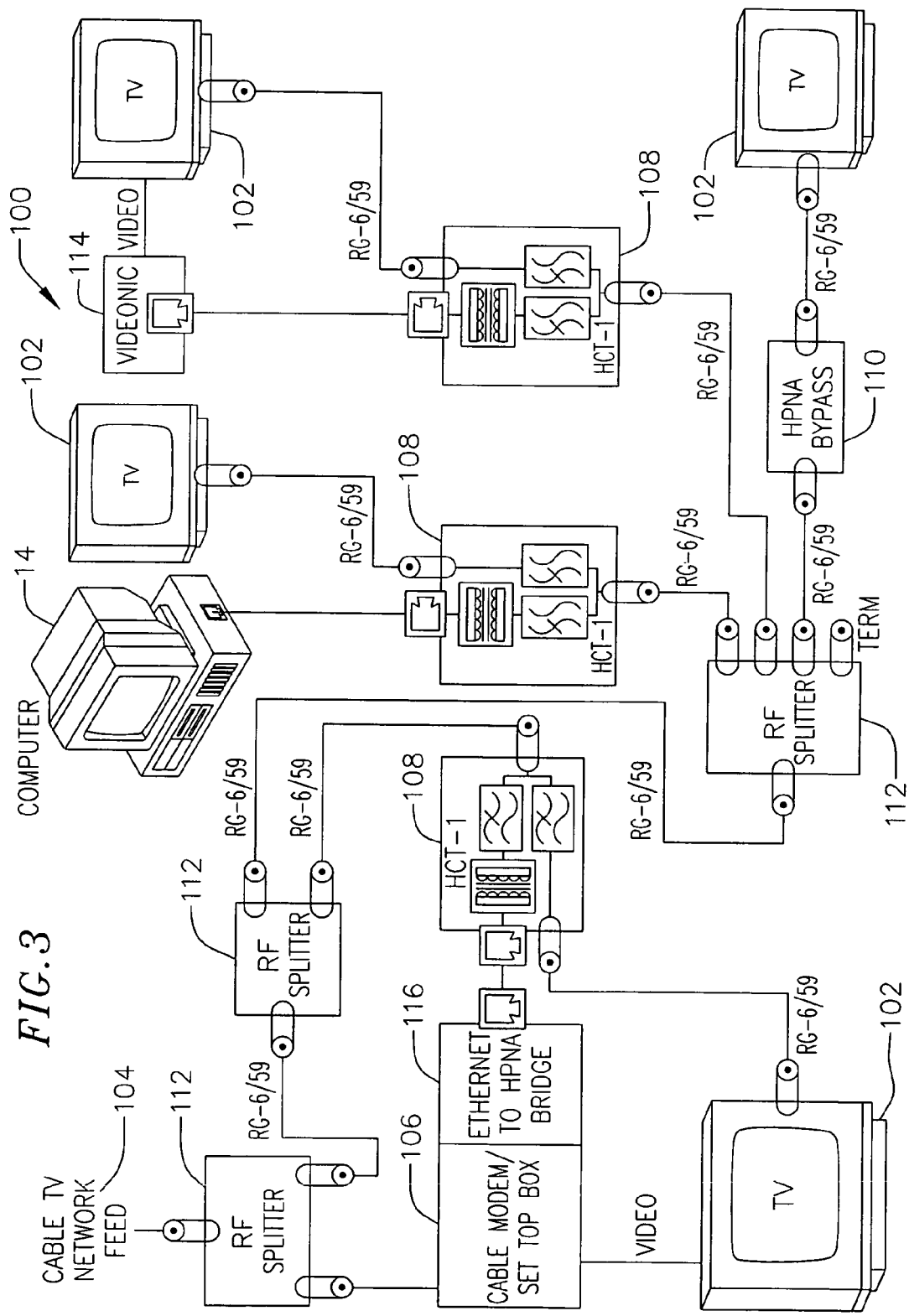
FIG. 3 is one embodiment implementing the present invention.

Referring to FIG. 3, one embodiment implementing the present invention is shown. System 100 includes computer 14, which can transmit and receive data in accordance with the HPNA protocol, and televisions 102 are interconnected over a coaxial cable transmission medium to Cable TV Network Feed 104. As the home entertainment market moves towards high bandwidth broadband digital media delivery, digital distribution of that media content within the home becomes essential. With the broadband access point at the home entertainment center via cable modem/set top box 106 and with an in-home network emanating from that point, it becomes possible to provide high-quality digital streaming video, VoIP and Internet access services throughout the home. In accordance with the present invention a simple way is provided to transport digital media using HPNA 2.0 traffic over 75Ω coaxial cable, in addition to phone cable as described above and shown in FIG. 1, that may already exist in a home wherein HPNA 2.0 communication traffic can coexist on the house's existing coaxial cable and provide high quality service to all nodes on most coaxial cable installations. Adapters 108 splice and match the HPNA signal into the coaxial cable, e.g., RG-6/59. The HPNA signal will coexist on the coaxial cable with most existing cable TV or off-air TV transmissions. In the limited cases in which there exists spectrum conflict, dedicated coax can be run from the point of entry to the DOCSIS cable modem or conditional access set top box. In accordance with the present invention adapters 108, described in more detail below, are simple passive three port devices which allow the HPNA 2.0 signals to coexist on the coaxial cable. In another aspect of the present invention, an inexpensive HPNA bandpass splitter device 110 is provided, also described in more detail below. To direct the Cable TV Network Feed 104 a series of RF splitters 112 are used. Video unit 114 receives and decodes a full-bandwidth MPEG2 video stream from cable modem/set top box 106. Cable modem/set top box 106 interfaces with adapter 108 through Ethernet to HPNA bridge 116.

Figure 4:
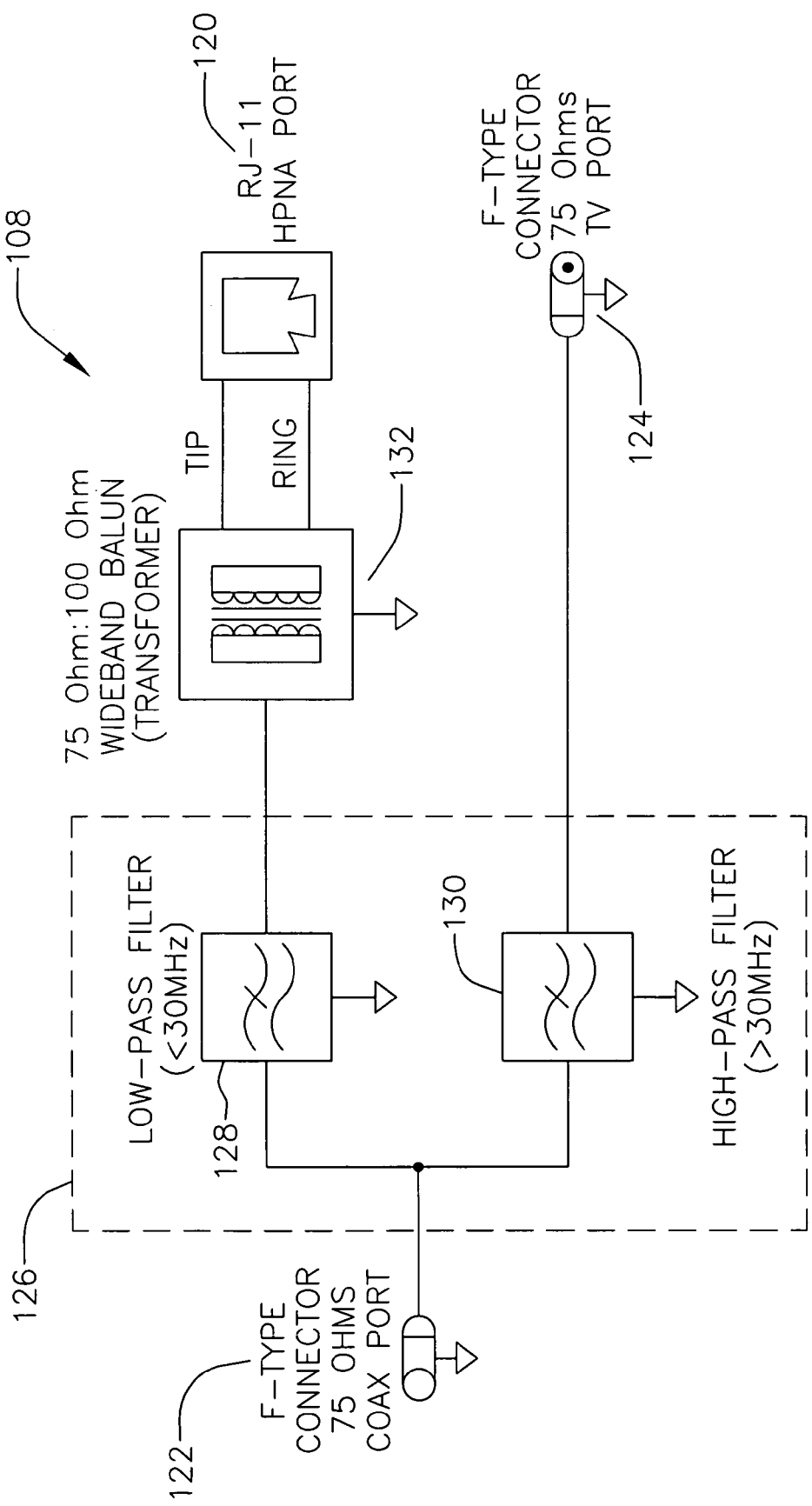
FIG. 4 shows in block diagram form a three port adapter in accordance with the present invention.

Referring to FIG. 4, adapter 108 is shown in block diagram form. Adapter 108 is used, one per phone cable based HPNA node on the coaxial cable system, to splice and impedance match the HPNA signal onto the coaxial cable. Adapter 108 (also identified as an HPNA to Coax Tap, or HCT) is a simple passive three port diplexer/balun device with coax to coax DC bypass. Adapter 108 includes HPNA—RJ11 connector port 120, Coax (to wall)—'F' type RF connector port 122, and TV—'F' type RF connector port 124. The electrical characteristics between the ports are as follows. There is isolation between the TV port 124 and HPNA port 120. Between the coax port 122 and TV port 124 there is DC continuity. Between the coax port 122 and HPNA port 120 and TV port 124 there is diplexer function 126 having low-pass filter 128 and high-pass filter 130, such that energy from the coax port 122 in the 4 to 30 MHz band is directed to the HPNA port 120 (and vice versa) and energy above about 30 MHz is directed to the TV port 124(and vice versa). Additionally, the HPNA port includes transformer/balun 132 to match the 75 ohm of the coaxial cable to the 135 ohm of the HPNA node.

Figure 5:
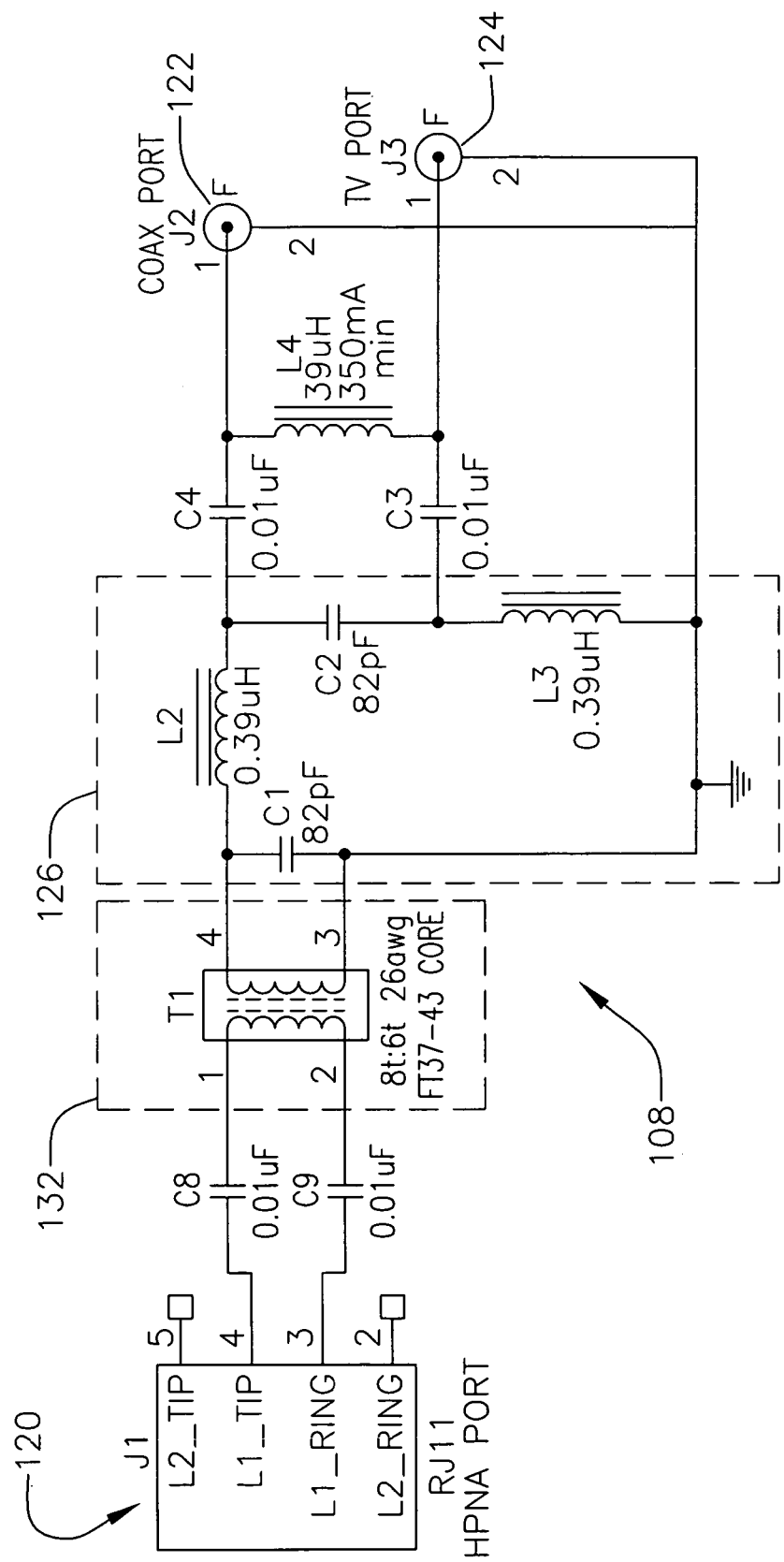
FIG. 5 shows the three port adapter of FIG. 4 in schematic form.

Adapter 108 as shown in FIG. 4 is shown in more detail schematically in FIG. 5. Transformer 132 has windings of 8t:6t of 26 awg coated copper wire on an Amidon FT23-43 core (or the like). This impedance matches the 135 ohm phone line of HPNA port 120 to the 75 ohm coax port 122 while simultaneously performing a balun function. Diplexer 126 is formed by the 82 pF capacitor C1/0.39 uH inductor L2 and 82 pF capacitor C2/0.39 uH inductor combination. A preferred diplexer cross-over frequency is 27.4 MHz, which is a convenient frequency between the top of the HPNA band and the bottom of the TV/Cable band. 0.01 uF capacitors C3, C4, C8 and C9 provide DC blocking. 0.39 uH 350 mA miniature inductor L4 provides a DC bypass between coax port 122 and TV port 124. Inductor L4's 350 mA minimum current rating allows up to 0.5A to pass between these ports without saturating inductor L4. Those skilled in the art can appreciate that the component values may be adjusted for circuit optimization.

Figure 6B:
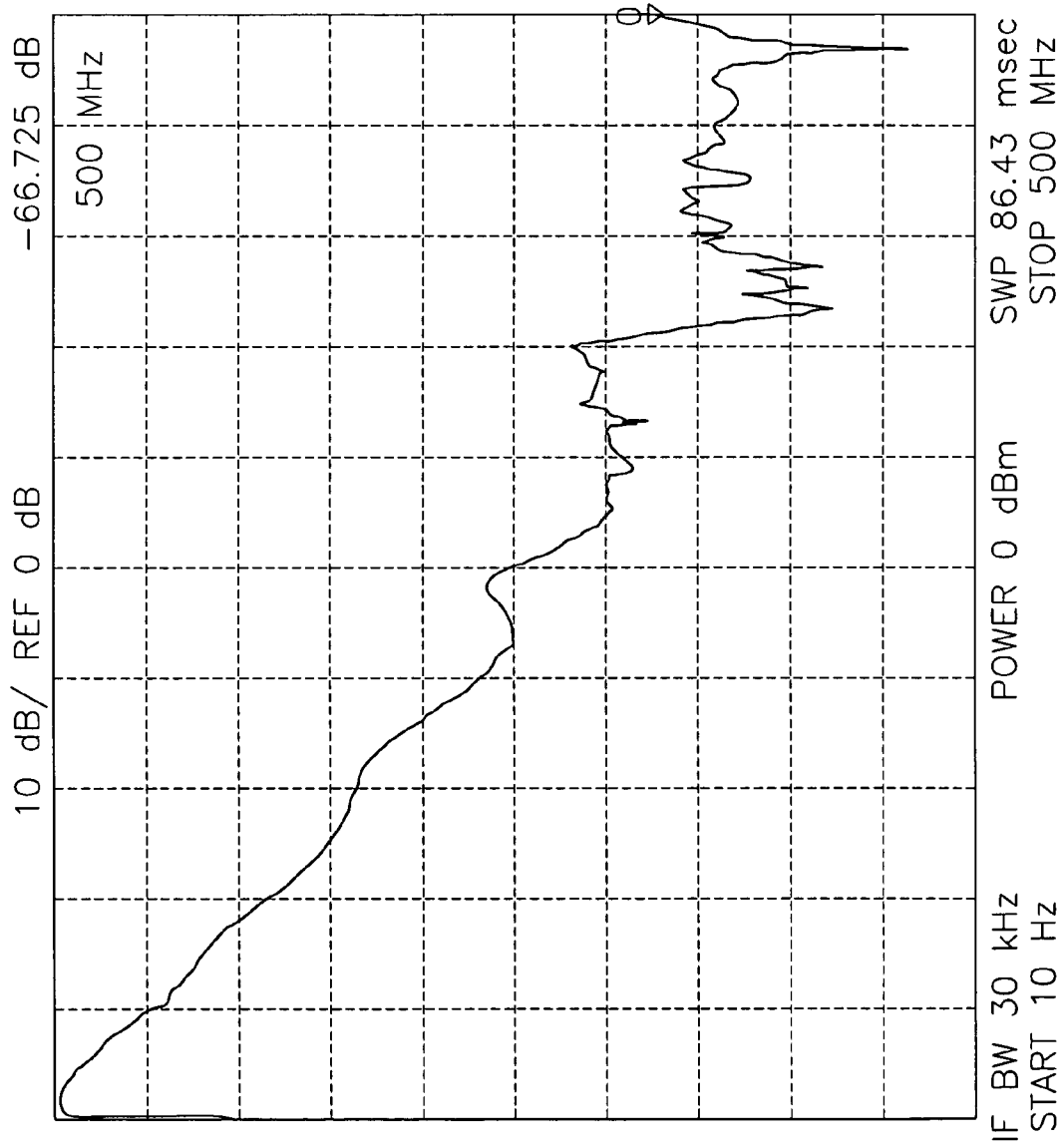

FIGS. 6a and 6b show the coax port to HPNA port frequency response of HCT adapter 108. FIG. 6a is for 0-10 MHz, while FIG. 6b is for 0-500 MHz. There is very low loss between the coax port and HPNA port in the HPNA band (about 1.2 dB maximum at 10 MHz) and excellent isolation between these two ports at frequencies above 30 MHz.

FIG. 7 shows the coax port to TV port frequency response of HCT adapter 108 for 0-500 MHz. There is very low loss (less than 1 dB) above 50 MHz between the coax port and TV port. Also it should be noted that there is good isolation between these two ports in the HPNA band. This will prevent stray IF interference from the TV from affecting the HPNA on the coaxial cable.

Figure 8A:
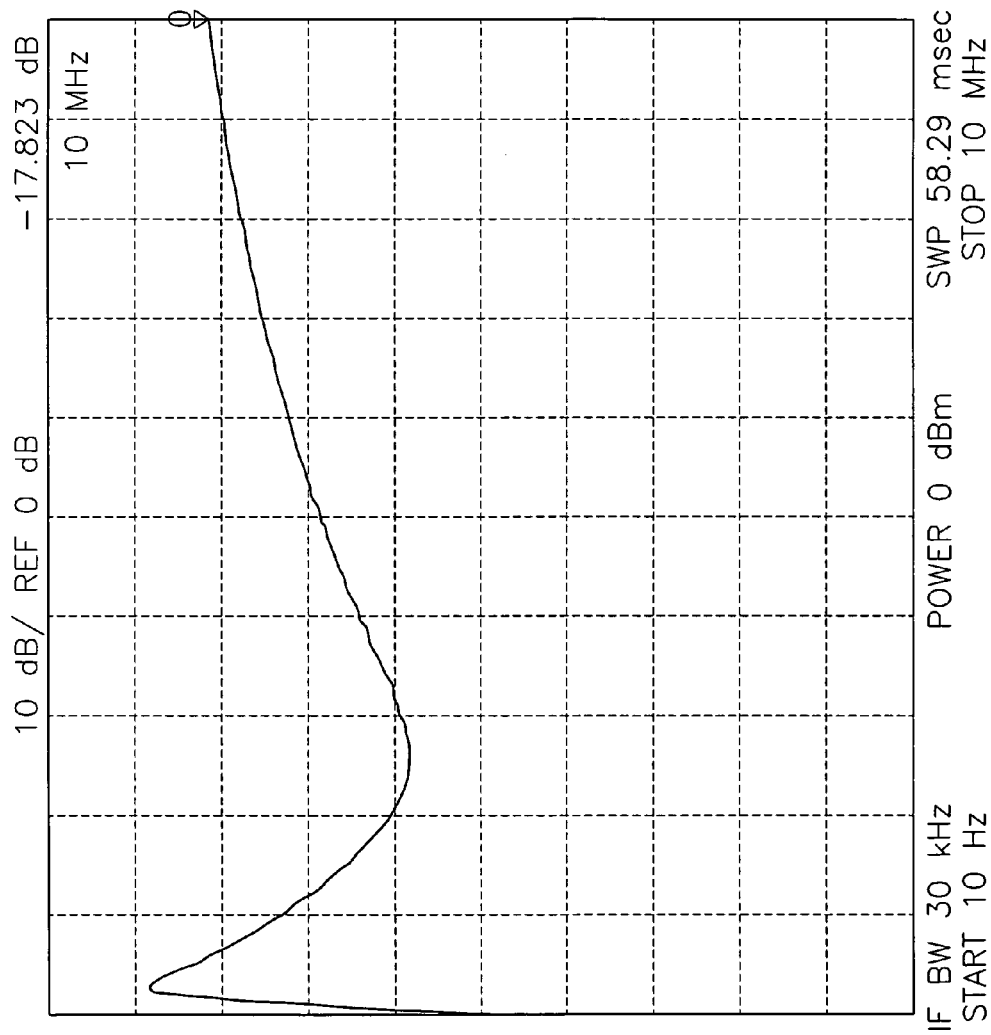
FIGS. 8a and 8b show the TV port to HPNA port frequency response of the three port adapter depicted in FIGS. 4 and 5.
Figure 8B:
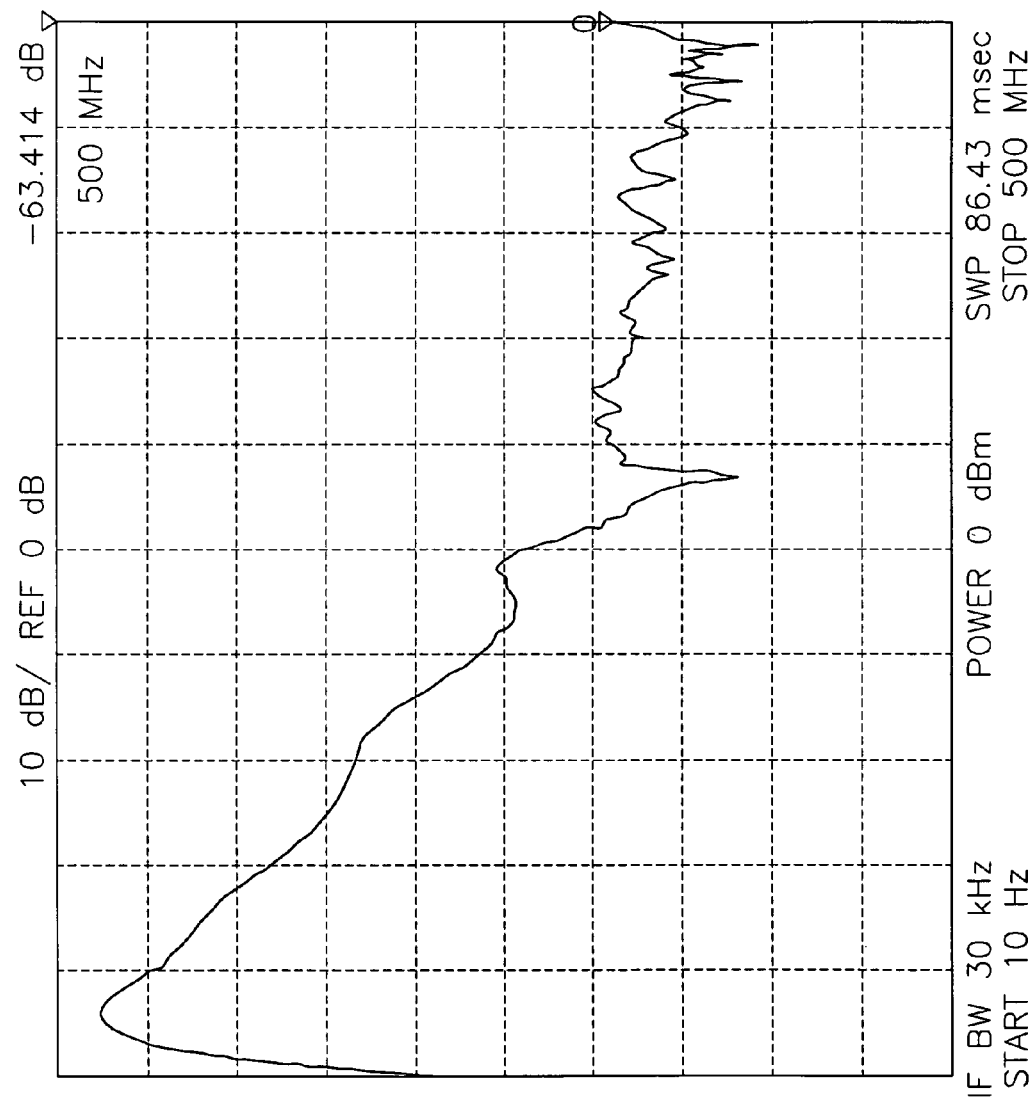

FIGS. 8a and 8b show the TV port to HPNA port frequency response of HCT adapter 108. FIG. 8a is for 0-10 MHz, while FIG. 8b is for 0-500 MHz. There is excellent isolation between the TV port and HPNA port at all frequencies. The worst case (at the diplexer crossover frequency of 30 MHz) is still better than 6 dB.

Figure 9:
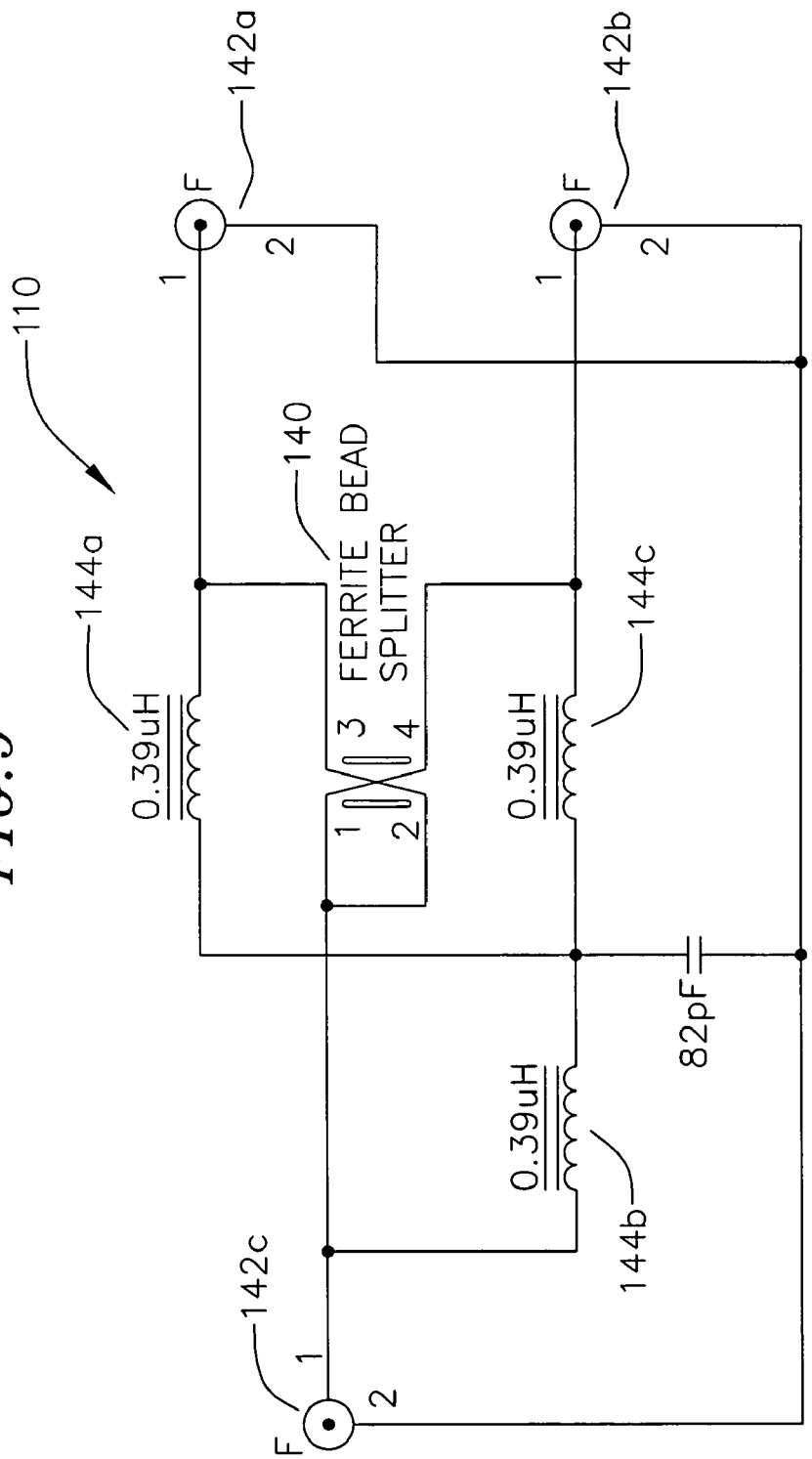
FIG. 9 is a schematic diagram of a bypass splitting adapter in accordance with the present invention.

Referring to FIG. 9, bypass splitting adapter 110 is shown center line 3L of the cylindrical piston bore 3, the distance D1 from the base portion of the reed valve element 35 to the center while also providing a bypass for HPNA frequencies between all ports. Bypass splitting adapter 110 replaces conventional RF splitters in wiring situations where there are multiple levels of RF splitters. Conventional RF splitters, found in nearly all home coaxial cable wiring systems, have significant isolation (loss) between its output ports at frequencies above a 2 or 3 MHz. Since HPNA adapters use frequencies above 4 MHz, conventional RF splitters need to have an additional bandpass function. Essentially, bypass splitting adapter 110 is a conventional splitter with extra passive components added to provide a bypass for the HPNA frequencies between all ports on the splitter. Ferrite bead splitter provides the power split function with isolation between the two output ports 142a, 142b at VHF/UHF, while three 0.39 µH inductors 144a, 144b, 144c and 82 pF capacitor 146 provide a low-loss path between all three ports 142a, 142b, 142c for HPNA signals. Those skilled in the art can appreciate that simply by adding more 0.39 µH inductors, one per port, multi-port HBS products can easily be produced.

Figure 10B:
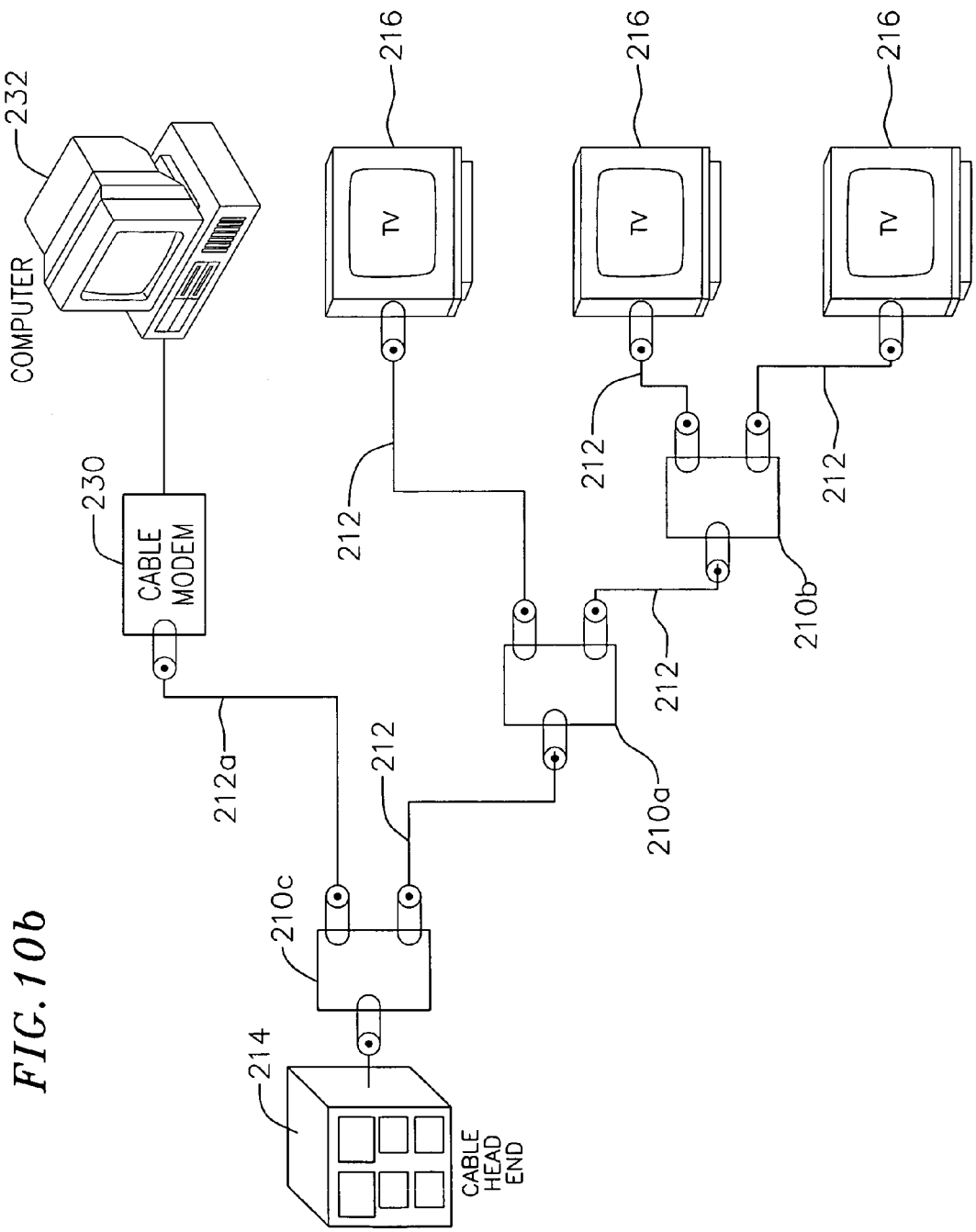

Representative typical environments within which the present invention can be most useful are shown referring to FIGS. 10a and 10b. Although there are many possible scenarios in homes, the embodiments of the present invention set forth in FIGS. 11-16 are representative of typical scenarios including systems which may have installations of an entertainment (e.g. Direct Broadcast System (DBS), Multi Service Operator (MSO)) system that uses HPNA over coaxial cable.

Referring to FIG. 10a, typical home coaxial cable installation 200 is shown. Two levels of splitters 210a, 210b feed coaxial cables 212 to most rooms in the house, connecting cable head end 214 with televisions 216. In FIG. 10b an additional splitter tier 210c for connecting cable head end 214 through additional cable 212a and cable modem 230 to computer 232 is added to the system of FIG. 10a.

Figure 11:
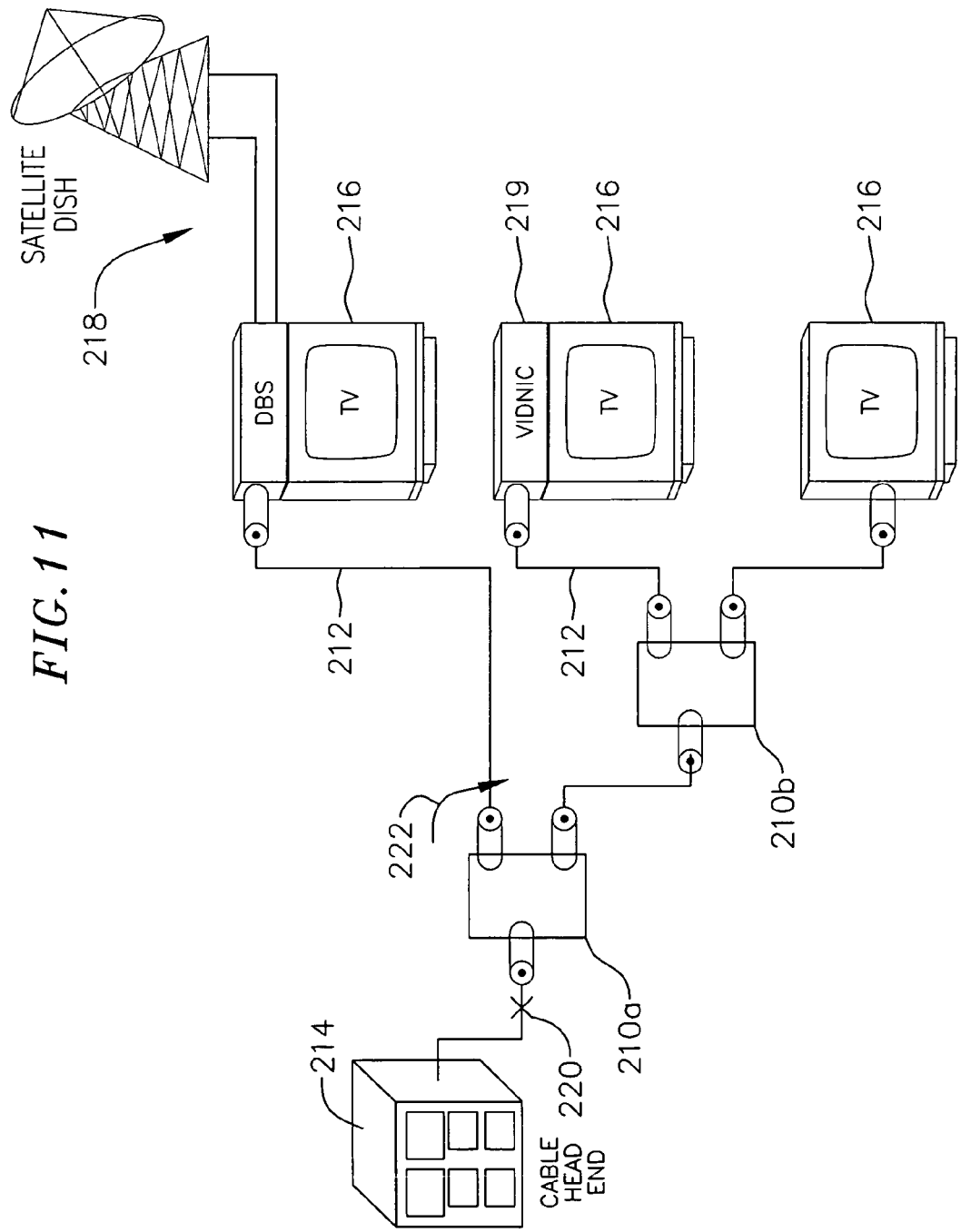
FIG. 11 shows an embodiment in accordance with the present invention.

In FIG. 11, the existing cable broadcast services shown in FIG. 10a is replaced with DBS 218. In addition Video NIC device 219 is included, wherein a full bandwidth MPEG2 video stream is desired to be received and decoded. "X" 220 indicates where the exiting cable is cut. Arrow 222 indicates where a splitter is reoriented. Typically, a house will only use either cable TV or an off-air antenna but not both, since that would require doubling up every coaxial cable run in the house. The "top of the tree" point is a point of entry where the cable TV or antenna gets fed into the house's coaxial wiring plant. This is usually at the top of the splitter tree 210a, 210b. Typically, up to two or three "levels" of splitters may be used. RF splitters can be two-, three- or four-way devices. They are simple passive devices that have about 4 dB split loss per two way split and about 10 dB of isolation between the output ports per two way split over a frequency range from below 5 MHz to above 500 MHz. Two-way splitters have the least split loss and isolation. Internally, three- and four-way splitters use multiple cascaded two-way splitters to achieve the multi-way split. A three-way splitter consists of 2 two-way splitters and a four-way splitter consists of 3 two-way splitters. In the worst case, a four-way splitter has about 8 dB loss per split and about 20 dB isolation between the extremities of the splitter tree. Path loss of 4 db per two-way split down the splitter tree from the top is acceptable for HPNA 2.0 which will work at full rate up to about 28 dB attenuation. The attenuation of the coaxial cable (RG-6 or RG-59) 212 at HPNA frequencies (4 to 10 MHz) over the typical distances found in a home is insignificant. In a typical home, if two-way splitters were used, the worst case coax path loss from the end of any one coaxial cable to another would only be 14 dB. (4 dB going up the tree from the second level splitter plus 10 dB across the top-level splitter). If the same two level system used four-way splitter devices instead of two way devices, the worst case coax path loss from the end of any one coaxial cable to another could be as much as 28 dB. (8 dB from the second level splitter plus 20 dB across the top level splitter.) HPNA would still be able to provide full performance with this level of attenuation. For streaming video, VoIP or Internet access services from the broadband access point at the top of the splitter tree down to any end node, the end-to-end path loss will be 22 dB (=8+8+3+3 dB, per our worst case with all four way splitters used scenario). As previously noted, this will not affect the performance of the HPNA system. For the initial introduction of HPNA 2.0 over coaxial cable systems it is anticipated that all streaming of high-speed video will be from the top of the splitter tree. End node to end node traffic is likely to have only low bandwidth needs and so a path loss of even 42 dB should still be considered acceptable. Services that need high bandwidth between the end nodes or coaxial cable installations with more than two levels of four-way splitters will require some level of mitigation to remove the isolation loss between output ports on the splitters in the HPNA frequency band. Similarly, more levels of splitters will require mitigation of isolation loss at more than one device. Essentially, existing splitter configurations have a few extra passive components added to them to provide a bypass for the HPNA frequencies between all ports on the splitter. Likewise, for households that wish to receive MSO services, HPNA over coaxial cable can distribute digital data over the coaxial cable used to distribute the cable content. Architectures with MSO services generally require one extra run of coaxial cable to the new main STB and possible reorientation of some of the existing splitters. This allows the existing coaxial cable to be reused with the main STB becoming the top of the distribution tree.

Figure 12:
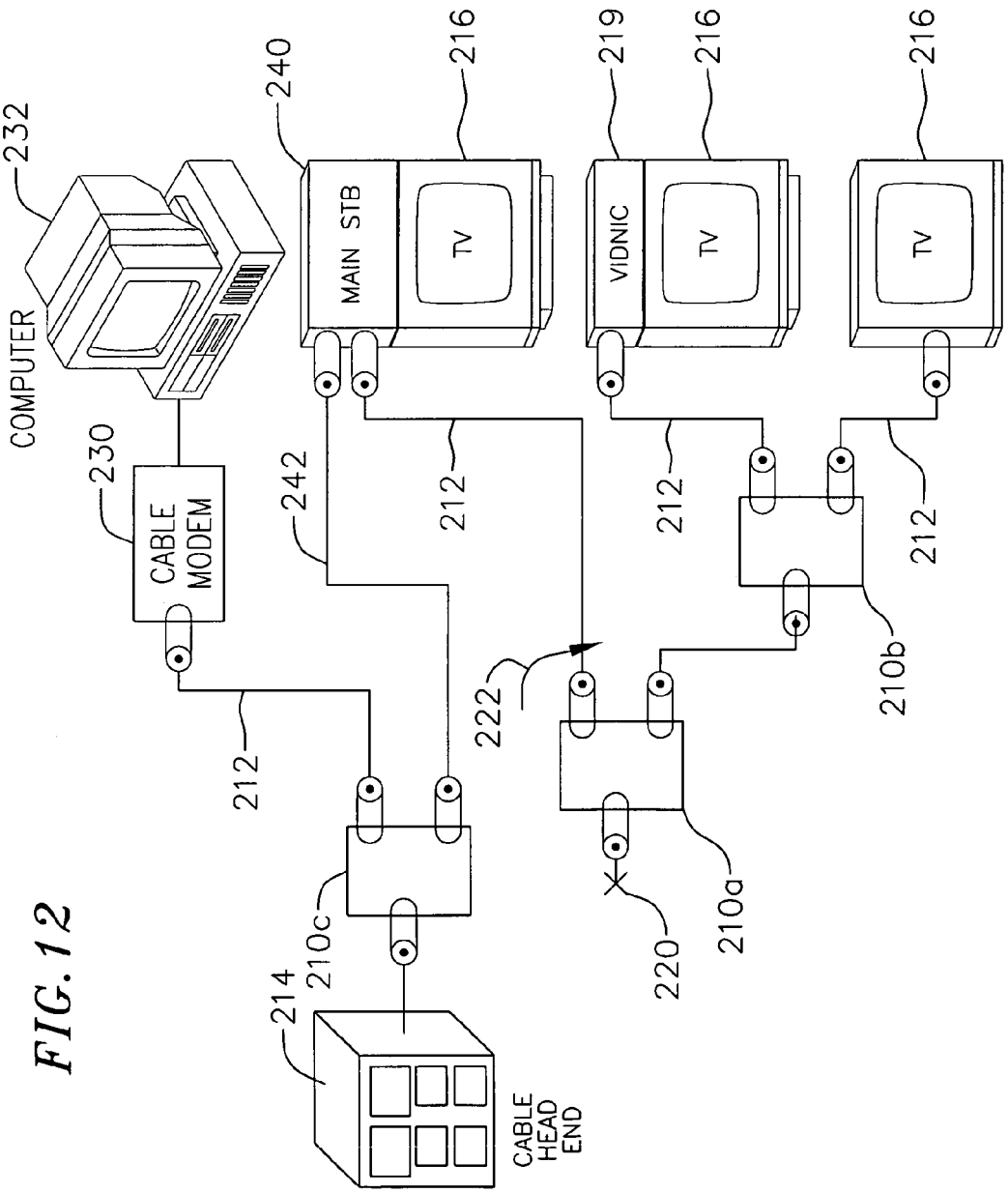
FIG. 12 shows a further embodiment in accordance with the present invention.
Figure 13:
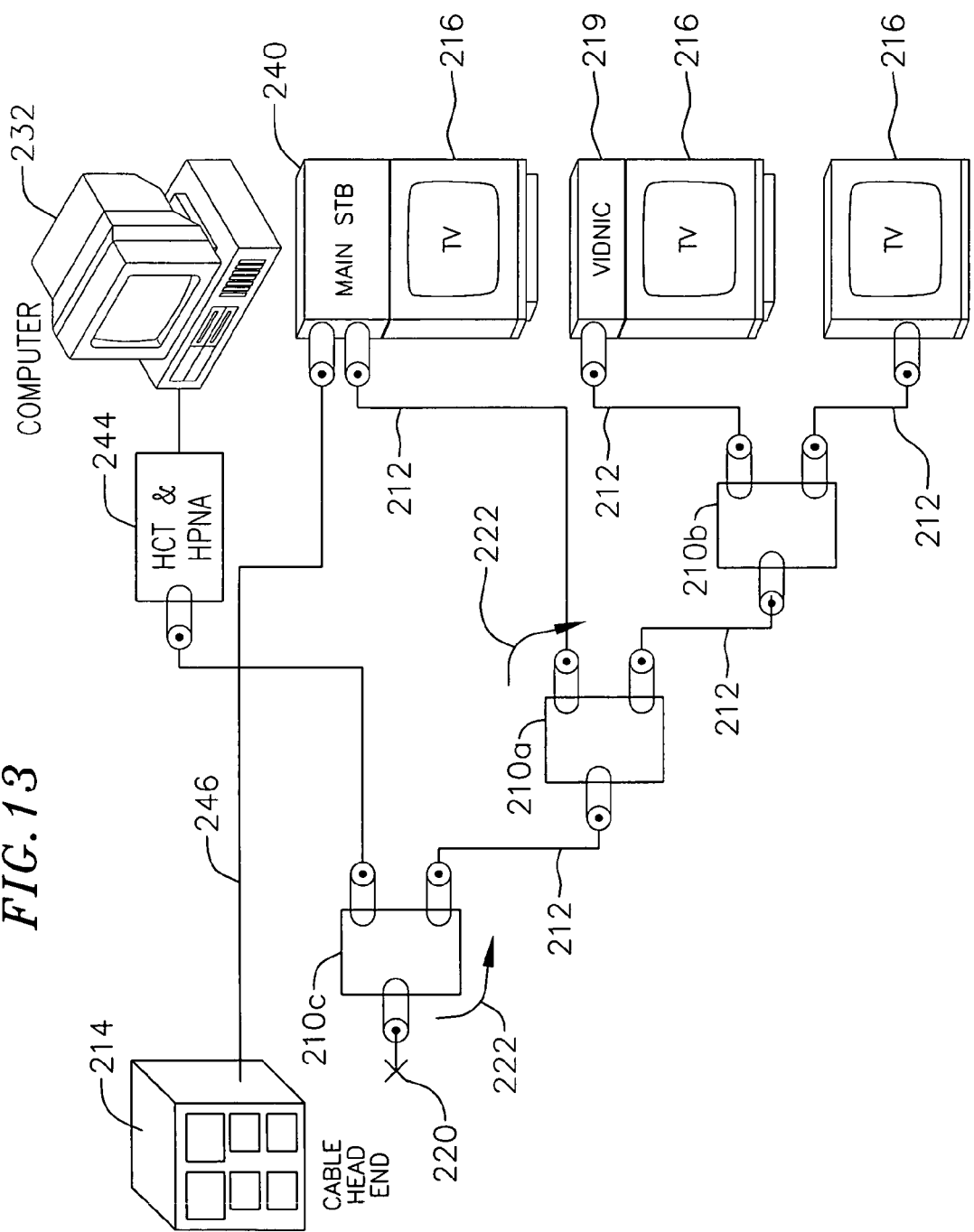
FIG. 13 shows still another embodiment in accordance with the present invention.

Referring now to FIG. 12, there is depicted a system wherein MSO content is provided with a DOCSIS cable modem. Main STB 240 does not include a DOCSIS cable modem. Content is transmitted from cable headend 214 to main STB 240 using new coaxial cable run 242 and the existing coaxial cable tree is used to distribute digital data from the main STB as well as relay the RF content through the main STB. Any DOCSIS cable modems 230 use existing coaxial cable separate from the HPNA over coaxial cable network. Alternatively, if main STB 240 does contain DOCSIS cable modem functionality, existing cable modem 230 becomes redundant. In these types of scenarios, the existing coaxial cable is used to distribute digital data from main STB 240 using HPNA. Existing cable modem 230 as seen in FIG. 12 is replaced with an HCT and a HPNA adapter 244 as shown in FIG. 13. Again, content is transmitted from cable headend 214 to main STB using new coaxial cable run 246 and the existing coaxial cable tree is used to distribute digital data from the main STB as well as relay the RF content through the main STB.

Figure 14:
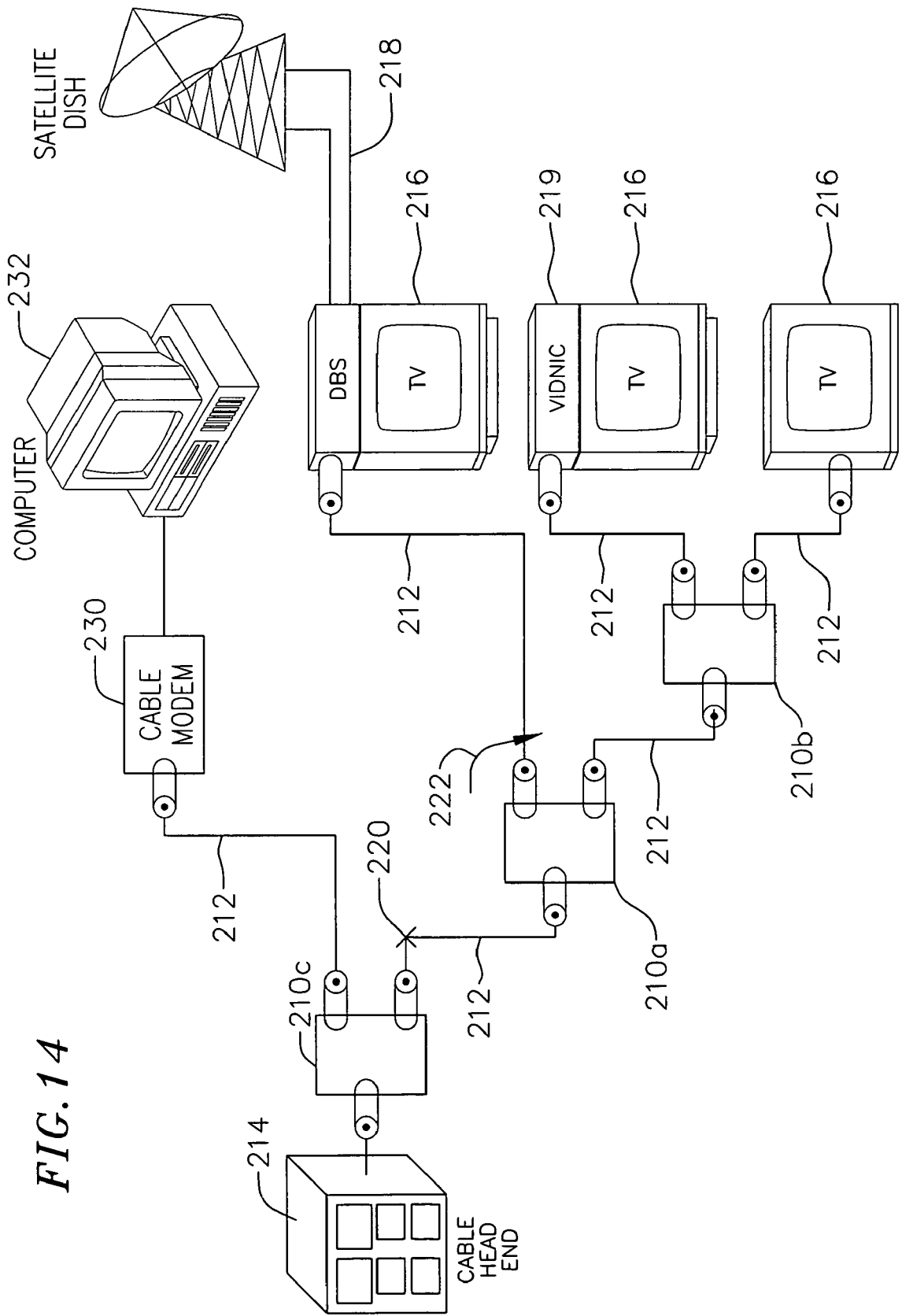
FIG. 14 shows a still further embodiment in accordance with the present invention.

Referring now to FIG. 14, the scenario shown is similar to the DBS scenario shown in FIG. 11 except that the customer retains cable modem service in addition to DBS content. The topology is similar except that the cabling for cable modem 230 is separated from the other coaxial cabling.

Figure 15:
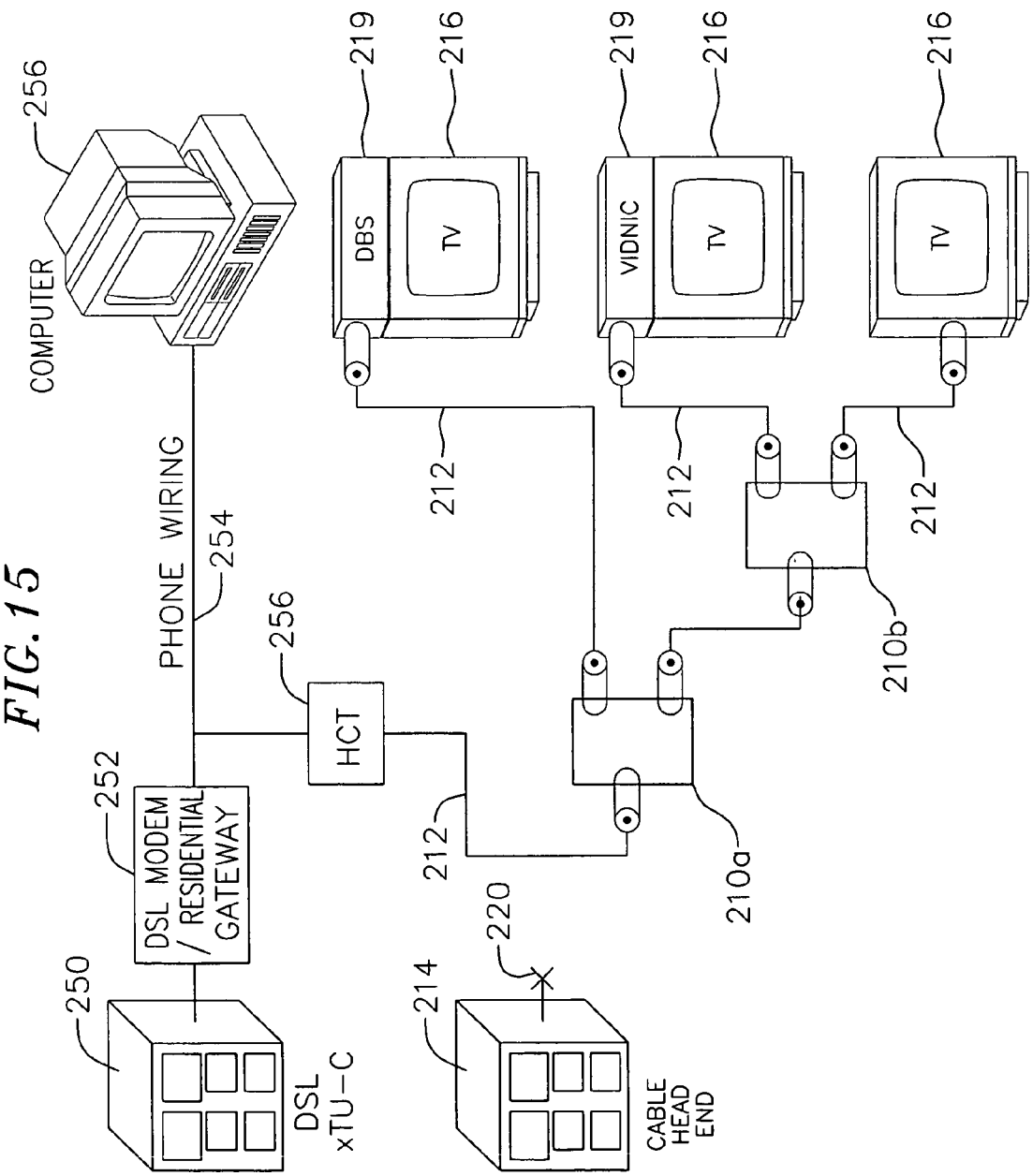
FIG. 15 is still another embodiment in accordance with the present invention.

Referring now to FIG. 15, there is shown a typical topology for a home that receives content via a DSL provider 250. The DSL access line is terminated in DSL modem with a residential gateway (router)252. Existing telephone wiring 254 can be used to connect computer device. An HCT adapter 256 is added to bridge the telephone wiring to the coaxial cable wiring 212 in which digital video signals can be distributed to STBs/Video NICs 219.

Figure 16:
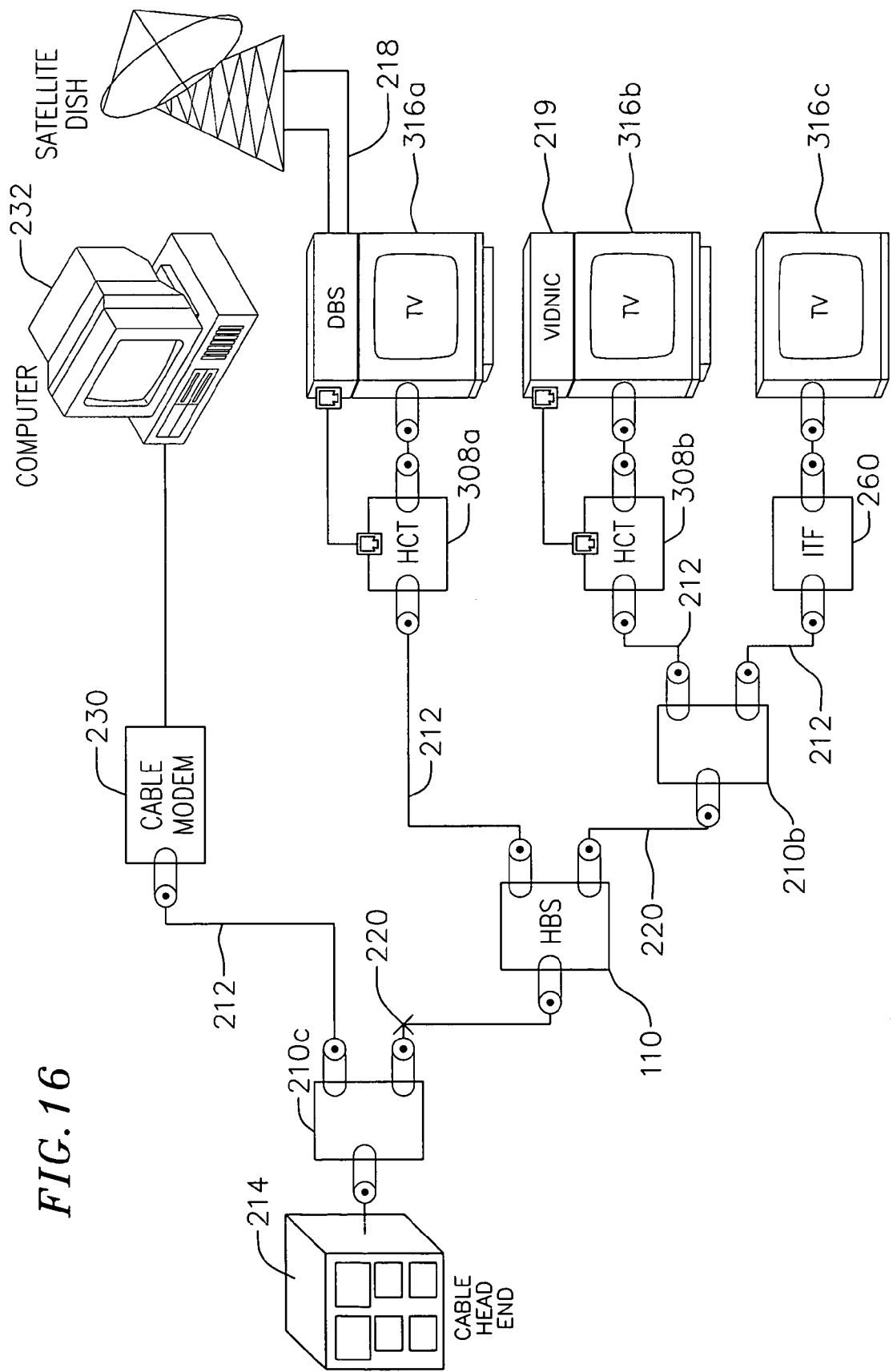
FIG. 16 is yet another embodiment in accordance with the present invention.

Referring to FIG. 16, another embodiment of the present invention is shown wherein a system having cable head 214, cable modem 230/computer 323, DBS system 218, Video NIC 219, and televisions 216 is provided that combines the use of the HCT adapter 108 as depicted in FIGS. 4 and 5, HBS splitter 110 as depicted in FIG. 9 and includes IF TV noise filter (ITF) 260. HBS 110 replaces splitter 210a of FIG. 13. HCT adapter 308a interfaces between DBS 218, television 316a and HBS adapter 110. HCT adapter 308b interfaces between Video NIC 219, television 316b and an output port of splitter 210b. ITF 260 is coupled between an other output port of splitter 210b and television 316c. ITF 260 mitigates Intermediate Frequency TV noise that may be coupled onto the coaxial cable from the input F-connector on a television. IF noise typically is centered around 6 MHz which fails directly in the 4 to 10 MHz HPNA band. ITF 260 is a 2-port device with two F-type 750 connectors on it, one for the Coax connection (wall) and the other for the TV. A third port would be internal to the device (the "HPNA" port) and be terminated with a resistor. ITF 260 would direct all energy from the TV below 30 MHz into the internal terminated port, thus, no interfering energy in the HPNA band would appear on the coax port.

Those skilled in the art can appreciate that there could be variations or equivalent embodiments which implement the present invention. For example, while the present embodiments depict an adapter as a physically separate unit with one of the ports being a telephone line, those skilled in the art might envision devices having an embedded adapter with just one physical coaxil port and internally the signal after the low-pass filter and balum will connect directly to the HPNA transceiver without ever transiting on a telephone line.

The invention claimed is:

1. A method for splitting television signals propagating over a coaxial cable system comprising:
    providing a three port adapter, the three port adapter having a first coaxial cable port, a second coaxial cable port and a third coaxial cable port,
    the first coaxial cable port splitting power between the second coaxial port and the third coaxial port through a ferrite bead splitter, the first coaxial cable port,
    the second coaxial cable port and the third coaxial cable port being coupled to each other through an inductor capacitor circuit, wherein:
        a low loss path is provided between the first coaxial port, the second coaxial port and the third coaxial port at frequencies propagating home networking communication signals; and
        a high loss path is provided between the second coaxial port and the third coaxial port at television frequencies.

2. A splitter apparatus for splitting television signals propagating over a coaxial cable system comprising:
    a three port adapter, the three port adapter having a first coaxial cable port, a second coaxial cable port and a third coaxial cable port,
    the first coaxial cable port splitting power between the second coaxial port and the third coaxial port through a ferrite bead splitter, the first coaxial cable port,
    the second coaxial cable port and the third coaxial cable port being coupled to each other through an inductor capacitor circuit, wherein:
        a low loss path is provided between the first coaxial port, the second coaxial port and the third coaxial port at frequencies propagating home networking communication signals; and
        a high loss path is provided between the second coaxial port and the third coaxial port at television frequencies.

3. The splitter apparatus of claim 2, further comprising providing in the three port adapter a DC bypass path between the third coaxial port and the second coaxial cable port.

4. The splitter apparatus of claim 2, wherein the low loss path passes signals in the 4 to 30 MHz band and the high loss path passes signals greater than 30 MHz.

5. The method of claim 1, further comprising providing in the three port adapter a DC bypass path between the third coaxial port and the second coaxial cable port.

6. The method of claim 1, wherein the low loss path passes signals in the 4 to 30 MHz band and the high loss path passes signals greater than 30 MHz.

7. The method of claim 1, wherein the home networking communications signals are in accordance with Home Phoneline Networking Alliance (HPNA) specifications.

8. The method of claim 1, wherein the three-port adapter includes at least a fourth coaxial port, and wherein the second coaxial cable port and the at least fourth coaxial cable port being coupled to each other through an inductor capacitor circuit.

* * * * *